(12) United States Patent
Stumborg et al.

(10) Patent No.: US 6,291,876 B1
(45) Date of Patent: Sep. 18, 2001

(54) ELECTRONIC DEVICES WITH COMPOSITE ATOMIC BARRIER FILM AND PROCESS FOR MAKING SAME

(75) Inventors: Michael F. Stumborg; Francisco Santiago, both of Fredericksburg, VA (US); Tak Kin Chu, Bethesda; Kevin A. Boulais, Waldorf, both of MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/137,088

(22) Filed: Aug. 20, 1998

(51) Int. Cl.[7] .................................................. H01L 23/58

(52) U.S. Cl. ........................... 257/632; 257/739; 257/773

(58) Field of Search ................................... 257/750, 741, 257/744, 773, 739, 632; 438/618, 652, 666

(56) References Cited

U.S. PATENT DOCUMENTS

| 4,291,327 | 9/1981 | Tsang | 357/52 |
|---|---|---|---|
| 4,502,209 | 3/1985 | Eizenberg et al. | 29/589 |
| 4,550,331 | 10/1985 | Milano | 357/24 |
| 4,692,993 | 9/1987 | Clark et al. | 437/53 |
| 4,847,666 | 7/1989 | Heremans et al. | 357/16 |

(List continued on next page.)

FOREIGN PATENT DOCUMENTS

| 851483 | 7/1998 | (EP) | H01L/21/768 |
|---|---|---|---|
| 881673 | 12/1998 | (EP) | H01L/21/768 |
| 402143531-A | * 6/1990 | (JP) | 257/632 |
| 2-266569 | 10/1990 | (JP) . | |

OTHER PUBLICATIONS

Gardner, D., et al., "Encapsulated Copper Interconnection Devices Using Sidewall Barriers", Proc. 8th International IEEE VLSI MVIC, pp. 99–108.

S.M. Sze, "Semiconductor Devices Physics and Technology", 1985, pp. 208–210.

Truscott, et al., "MBE growth of $BaF_2/(Ga,In)(As,Sb)$ Structures", Journal of Crystal Growth, vol. 81 (1987), pp. 552–556.

Clemens, et al., "Growth of $BaF_2$ and of $BaF_2/SrF_2$ layers on (001) oriented GaAs", J. Appl. Phys., vol. 66, No. 4, Aug. 15, 1989, pp. 1680–1685.

(List continued on next page.)

Primary Examiner—Olik Chaudhuri
Assistant Examiner—Theresa T. Doan
(74) Attorney, Agent, or Firm—James B. Bechtel, Esq.

(57) ABSTRACT

A semiconductor device having a barrier film comprising an extremely thin film formed of one or more monolayers each comprised of a two-dimensional array of metal atoms, in which more than one type of metal atom is provided in barrier film. In one exemplary aspect, the barrier film is used for preventing the diffusion of atoms of another material, such as a copper conductor, into a substrate, such as a semiconducting material or an insulating material. In one mode of making the semiconductor device, the barrier film is formed by depositing different types of precursors, such as metal halides (e.g., $BaF_2$ and $SrF_2$), onto the substrate material, and then annealing the resulting film on the substrate material to remove all of the constituents of the temporary heteroepitaxial film except for a monolayer of metal atoms left behind as attached to the surface of the substrate. A conductor, such as copper, deposited onto the barrier film is effectively prevented from diffusing into the substrate material even when the barrier film is only one or several monolayers in thickness. The extremely thin barrier film makes possible a significant increase in the component density and a corresponding reduction in the number of layers in large scale integrated circuits, as well as improved performance.

17 Claims, 12 Drawing Sheets

U.S. PATENT DOCUMENTS

| | | | |
|---|---|---|---|
| 4,965,656 | | 10/1990 | Koubuchi et al. ............ 357/71 |
| 5,124,762 | | 6/1992 | Childs et al. ............ 357/16 |
| 5,225,031 | | 7/1993 | McKee et al. ............ 156/612 |
| 5,248,633 | | 9/1993 | Morar et al. ............ 437/196 |
| 5,378,905 | | 1/1995 | Nakamura ............ 257/213 |
| 5,389,575 | | 2/1995 | Chin et al. ............ 437/190 |
| 5,391,517 | | 2/1995 | Gelatos et al. ............ 437/190 |
| 5,435,264 | | 7/1995 | Santiago et al. ............ 117/92 |
| 5,482,003 | | 1/1996 | McKee et al. ............ 117/108 |
| 5,489,548 | | 2/1996 | Niskioka et al. ............ 437/60 |
| 5,547,901 | | 8/1996 | Kim et al. ............ 437/187 |
| 5,552,341 | | 9/1996 | Lee ............ 437/192 |
| 5,554,254 | | 9/1996 | Huang et al. ............ 156/625.1 |
| 5,593,951 | | 1/1997 | Himpsel ............ 505/235 |
| 5,624,874 | | 4/1997 | Lim et al. ............ 438/653 |
| 5,637,533 | | 6/1997 | Choi ............ 438/643 |
| 5,668,054 | | 9/1997 | Sun et al. ............ 438/653 |
| 5,670,420 | | 9/1997 | Choi ............ 437/189 |
| 5,677,572 | * | 10/1997 | Hung et al. ............ 257/750 |
| 5,690,737 | | 11/1997 | Santiago et al. ............ 117/92 |
| 5,695,810 | | 12/1997 | Dubin et al. ............ 427/96 |
| 5,696,018 | | 12/1997 | Summerfelt et al. ............ 437/190 |
| 5,753,040 | | 5/1998 | Cho ............ 117/106 |
| 5,773,359 | | 6/1998 | Mitchell et al. ............ 438/614 |
| 5,824,599 | | 10/1998 | Schacham-Diamand et al. ... 437/230 |
| 5,932,006 | | 8/1999 | Santiago et al. ............ 117/92 |
| 5,962,921 | * | 10/1999 | Farnworth et al. ............ 257/773 |

OTHER PUBLICATIONS

Hung, et al., "Epitaxial growth of alkaline earth fluoride films on HF–treated Si and $(NH_4)_2 S_x$ treated GaAs without in situ cleaning", Appl. Phys. Lett., vol. 60, No. 2, Jan. 13, 1992, pp. 201–203.

Chaudhari, et al., "Calcium Fluoride thin films on GaAs (100) for possible metal–insulator–semiconductor applications", Appl. Phys. lett., vol. 62, No. 8, Feb. 22, 1993, pp. 852–854.

Colbow, et al., "Photoemission study of the formation of $SrF_2$/GaAs(100) and $BaF_2$/GaAs(100) interfaces", Physical Reviews B, vol. 49, No. 3, Jan. 15, 1994, pp. 1750–1756.

Chu, et al., "The Role of Barium in the Heteroepitaxial Growth of Insulator and Semiconductors on Silicon", Mat. Res. Symp. Proc., vol. 334, 1994, pp. 501–506.

Stumborg, et al., "Determination of growth mechanisms of MBE grown $BaF_2$ on Si(100) by target angle dependence of RBS yields", Nucl. Instr. and Methods in Physics Res. B, vol. 95, 1995, pp. 319–322.

Stumborg, et al., "Growth and interfacial chemistry of insulating (100) barium fluoride on gallium arsenide", J. Appl. Phys., vol. 77, No. 6, Mar. 15, 1995, pp. 2739–2744.

Stumborg, et al., "Surface chemical state populations in the molecular beam epitaxy deposition of $BaF_2$ on GaAs by x-ray photoelectron spectroscopy and heavy–ion backscattering spectroscopy", J. Vac. Sci. Technol., vol. 14, No. 1, Jan./Feb. 1996, pp. 69–79.

Chu, et al., "Heteroepitaxial deposition of Group IIa Fluorides on gallium arsenide", Mat. Sci. and Eng. B, vol. B47, 1997, pp. 224–234.

* cited by examiner

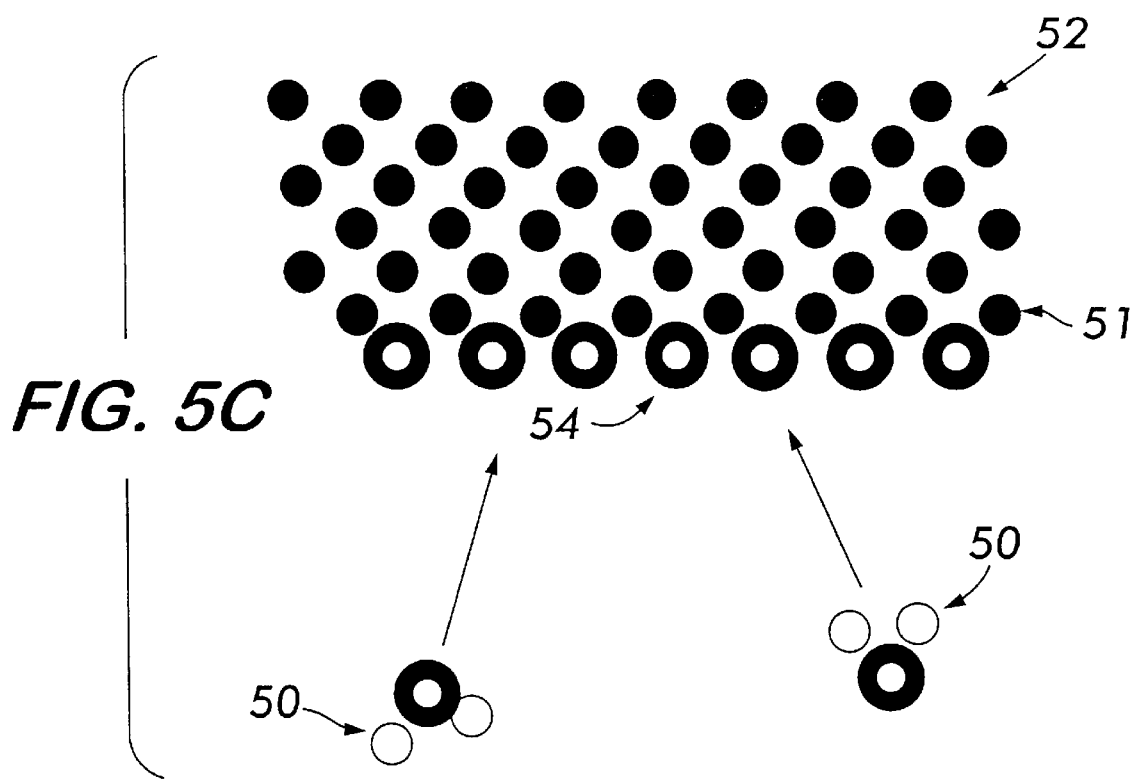

ELECTRONIC DEVICES WITH COMPOSITE ATOMIC BARRIER FILM AND PROCESS FOR MAKING SAME

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

This invention relates generally to the fabrication of electronic devices, and particularly to a novel barrier film for electronic and electro-optic materials.

Integrated circuits (ICs) are composed of many millions (sometimes billions) of components such as transistors, resistors, and capacitors. These individual components are laid out in a two dimensional array on a substrate such as silicon or gallium arsenide. The two dimensional arrays are often stacked one on top of another to form a three dimensional IC. As in any circuit, these components, and the several layers, must be connected to one another electrically. Interconnection on the two dimensional surfaces is accomplished by depositing strips of metal that act as connecting "wires." Likewise, the layers are interconnected by metal plugs deposited in via holes made between layers. These steps in the manufacturing process are commonly referred to as "metallization."

Generally, silicon is the substrate material of choice, aluminum is the metal of choice for two dimensional IC metallization, and tungsten is the metal of choice for filling via holes for multiple layer interconnection. Silicon is preferred because it is cheap and abundant. Aluminum and tungsten are chosen because they have adequate electrical conductivity and they can be made not to diffuse into the substrate during the many annealing operations inherent in the IC manufacturing process.

Because the electrical conductivity of aluminum and tungsten is limited, the "wires" and plugs must be made thick enough to ensure minimal resistance to electric current between components and between layers. The large size of these conductors has recently become an issue for IC designers and fabricators interested in placing a greater density of circuit elements on an IC. In order to achieve greater performance from ICs, the lateral dimensions of the circuit elements must be reduced. This reduction in IC element size has two detrimental effects on the resulting IC. First, it increases the resistance of the metal interconnects. Second, it increases the aspect ratio of the via holes, making them more difficult to fill with the metallic material. Incomplete filling of the via holes exacerbates the problem of high resistance. Today, there is often not enough space in the lateral direction on an IC chip to accommodate large aluminum conductors. Additionally, the size of the via holes, when filled with tungsten, limits the number of levels in the IC to no more than five.

Copper, which is a much better conductor of electricity than aluminum, is available as an alternative metallization material. Because of copper's greater electrical conductivity, copper imposes less resistance to the flow of electrons than aluminum or tungsten conductors having equivalent dimensions. The increasing density of components on today's ICs requires the smaller sized conductors that are only achievable by the use of highly conductive metallization materials.

Unfortunately, copper has one notable problem. It has a tendency to diffuse into silicon at elevated temperatures. This has precluded copper as a metallization candidate because ICs must be annealed several times during the manufacturing process. In order for copper metallization to be feasible, a technique must be developed that will prevent the diffusion of copper into silicon. Among the possible solutions currently under development within the semiconductor industry the most prevalent is the use of nitrides of the transition metals titanium and tungsten. The thickness of the metal-nitride layer required to stop copper diffusion into silicon effectively is in the range of tens to hundreds of nanometers, or hundreds to thousands of Angstroms (Å).

The problem of diffusion exists not only in the case of copper metallization on silicon, but also in the case of copper metallization on other single- and polycrystalline semiconductor substrate materials such as gallium arsenide, silicon carbide, germanium, and so forth. Copper diffusion into insulating materials such as $SiO_2$ can also result in short circuits, especially in dense arrays of IC components. Diffusion is also a problem with other high conductivity metallization materials such as gold, silver, and platinum.

An object of this invention is to provide a barrier film which is extremely thin, yet permits metallization using copper and other high conductivity metallic conductors which would otherwise have a tendency to diffuse into a substrate formed of a semiconducting or insulating material.

It is also an object of the invention to improve electronic and electro-optic devices by making it possible to achieve one or more of the following desirable characteristics: increased component density in large scale integration, reduced heat dissipation, increased speed of operation, and a decreased number of layers.

Still another object is to provide a procedure for forming an extremely thin diffusion barrier, which produces consistent results rapidly and reliably, and which is not highly dependent upon the accurate maintenance of operating conditions such as time and temperature.

Still another object is to provide a process for forming an extremely thin diffusion barrier which eliminates voids and mechanical stresses that can have detrimental effects on the substrate, the diffusion barrier, or the metallization layer.

SUMMARY OF THE INVENTION

In accordance with this invention, a semiconductor device is fabricated by forming, on a surface of a substrate material, a barrier film having a monolayer of metal atoms immediately adjacent the surface of the substrate material. In one aspect, a metallic conductor, which has a tendency to diffuse into the substrate material, is then deposited onto the barrier film. Metallic conductors which have a tendency to diffuse into substrates of semiconductor or insulating materials include, for example, pure copper, copper alloys (e.g., Cu—Al, Cu—Si—Al), copper doped with a dopant (e.g., aluminum) that impedes electromigration, gold, silver, or platinum. For purposes of this invention, a "monolayer" is understood to refer to a two-dimensional array of atoms having the thickness of one atomic layer; although the monolayer may have minuscule defects such as minute portions with a thickness that exceeds one atomic layer and/or minute portions that are voids, the average thickness nonetheless essentially is an atomic layer providing essentially complete coverage of the directly underlying substrate surface regions. The monolayer, which is extremely thin by definition, serves as a barrier film, inhibiting diffusion of the metallic conductor into the substrate material. For purposes of this application, the material upon which the monolayer of atoms is formed is often generally referred to herein as a "substrate" for such formation, and it will be appreciated that the term "substrate" as used herein can encompass a bulk wafer or, alternatively, a layer that is grown, deposited, formed or bonded upon another body. The present invention is especially concerned with substrates that are semiconductor or insulating materials.

In one preferred method of this invention, a monolayer is produced by depositing a metal halide upon a surface of a semiconducting or insulating substrate material where it first reacts with the substrate material and dissociates, releasing gaseous by-products formed of substrate atoms and halogen atoms of the precursor compound. This reaction is self-limiting resulting in formation of a monolayer of metal atoms on the substrate that thereafter enables a homoepitaxial film formed of the metal halide molecules to form thereon as the deposition process proceeds. This deposition operation can be carried out by various methods, but is preferably carried out by molecular beam epitaxy, or alternatively by r.f. sputtering. At this juncture, a temporary heteroepitaxial film has been formed on the substrate where the diffusion barrier is ultimately desired. Then, in a second stage of the procedure, the temporary heteroepitaxial film is subjected to a selective removal procedure, whereby the homoepitaxial portion of the deposited film having the halogen constituents is selectively eliminated while the monolayer of metal atoms remains behind attached to the surface of the substrate material. The removal procedure preferably is an annealing operation. Alternatively, chemical etching which is selective to remove the homoepitaxial portion of the deposited film while leaving the monolayer of metal atoms also can be used. In any event, the metal atom monolayer strongly adheres to the substrate material, and is not adversely affected by extended annealing times, high annealing temperatures, or chemical etching conditions.

The precursor compound preferably comprises a metal halide, e.g., a barium, strontium, cesium or rubidium- halide salt. The thickness of the monolayer basically corresponds to the diameter of the metal atom constituent (s) of the monolayer. Metal atoms of barium, strontium, cesium, rubidium, and so forth have a thickness (i.e., the diameter of the largest electron orbital) of less than 5 Å, so it can be appreciated that an extremely thin diffusion barrier layer is achieved by this invention. The semiconducting substrate materials that can be processed according to this invention include mono- or polycrystalline, doped or undoped, semiconductors, such as silicon, germanium, indium phosphide, gallium arsenide, silicon carbide, gallium nitride, aluminum nitride, indium antinomide, lead telluride, cadmium telluride, mercury-cadmium telluride, lead selenide, lead sulfide, tertiary combinations of these materials, and so forth. The insulating substrate materials that can be processed according to this invention include doped or undoped silicon oxides (e.g., silicon dioxide), silicon nitride, phosphosilicate glass (PSG), borophosphosilicate glass (BPSG), barium fluoride, strontium fluoride, calcium fluoride, and so forth.

In a further embodiment of this invention, a multiplicity of monolayers are formed contiguous with each other upon the substrate surface. This embodiment can become advantageous such as where a substrate is involved having a relatively greater surface roughness and it is necessary to account for any discontinuities in the surface profile by sufficiently building-up the diffusion layer to blanket the surface topography presented and provide complete coverage. To build-up multiple monolayers, one stacked upon the other, MBE deposition can be used to sequentially deposit additional monolayers of metal atoms using an elemental source of the metal. In this way, a diffusion barrier film thickness can be assembled up to any desired thickness, but preferably is maintained at or below not more than 100 Å, more preferably not more than 20 Å to meet the primary objective of providing an extremely thin yet effective diffusion barrier.

As can be appreciated, a semiconductor device is obtained by this invention in which a monolayer or several monolayers of metal atoms separates a metallic conductor from other materials in the device, such as semiconductor or insulating materials, in which the extremely thin diffusion barrier film serves as an effective barrier preventing atoms of the metallic conductor from diffusing into such other materials and either impairing the device or rendering it totally inoperative.

Various other objects, details and advantages of the invention will be apparent from the following detailed description when read in conjunction with the drawings.

BRIEF DESCRIPTION OF THE DRAWINGS

FIGS. 5A–E is a schematical illustration showing the interfacial structure of the diffusion barrier on an atomic level as it is being formed on a semiconductor substrate after various process steps according to an inventive process;

FIG. 7A is a schematical illustration showing the interfacial structure of the barrier film on an atomic level where the barrier film is comprised of a plurality of contiguous monolayers, while

DETAILED DESCRIPTION

Figure 1:
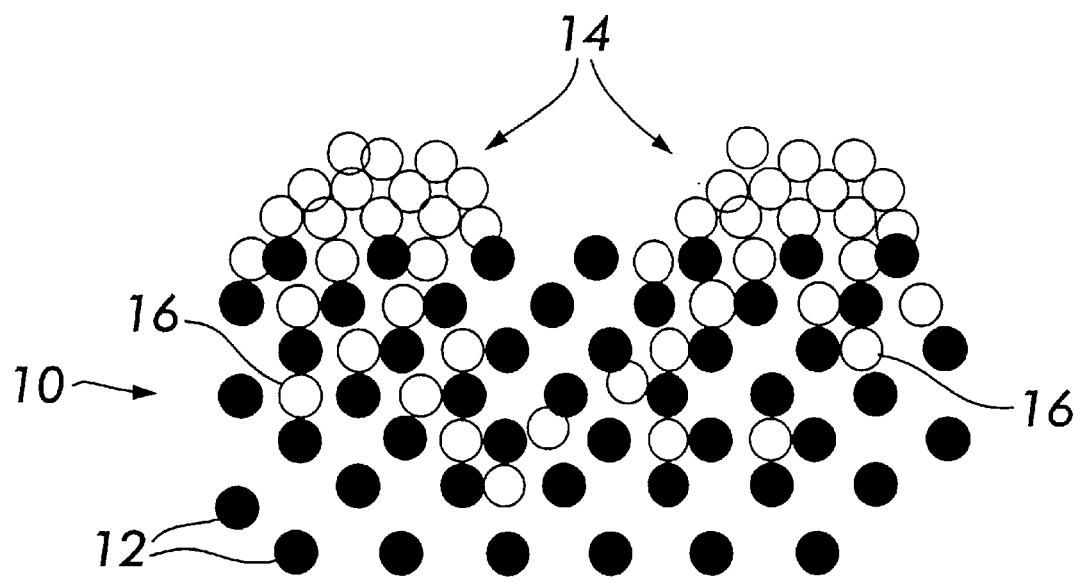
FIG. 1 is a schematic cross-section depicting diffusion of copper into a silicon substrate, where no diffusion barrier is present.

FIG. 1 illustrates a typical attempt at copper metallization of a silicon semiconductor substrate 10. The substrate, which is made up of silicon atoms 12, has two laterally delineated copper interconnect strips 14 deposited on its surface. In the annealing process, copper atoms 16 tend to diffuse into the substrate, impairing its semiconducting properties, and usually rendering it totally inoperative, by effectively creating an electrical short circuit. Similar diffusion occurs at an interface between a copper conductor and a $SiO_2$ insulating layer, for example in the case in which an attempt is made to deposit a conducting copper plug in a via hole in the SiO$_2$ insulating layer. Diffusion of copper atoms into the SiO$_2$ insulating layer impairs its effectiveness as an insulator and may have a serious adverse effect on the properties of the device.

Figure 2:
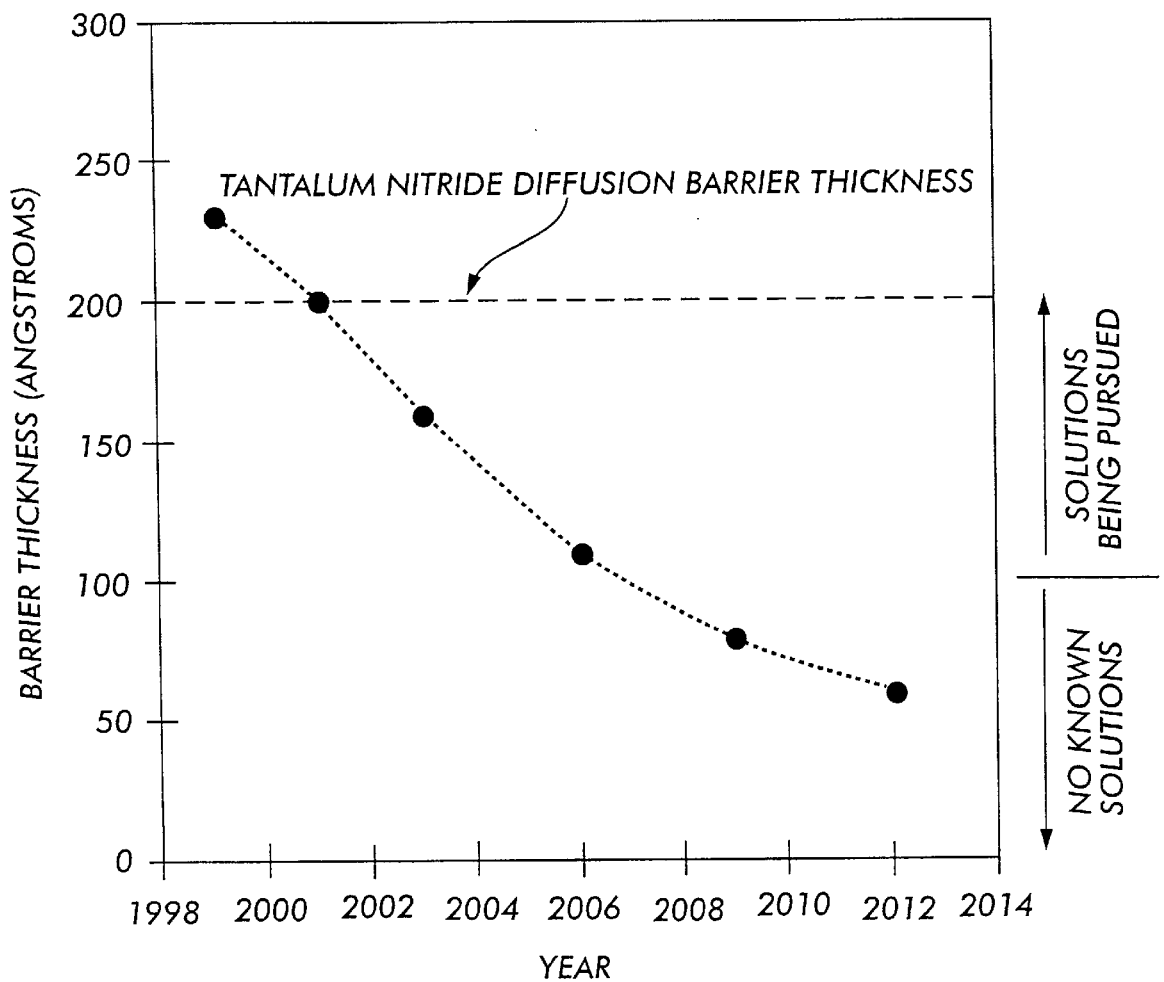
FIG. 2 is a graph illustrating the projected requirement in diffusion barrier thickness by the Semiconductor Industry Association.

As mentioned above, various attempts have been made to achieve a diffusion barrier to permit the use of copper conductors in semiconductor devices. The most attention so far has been given to the use of nitrides of tungsten and titanium. Various other diffusion barrier materials, for example tantalum nitride, have also been tried. As shown in FIG. 2, which is based on published Semiconductor Industry Association data, presently achievable diffusion barrier thicknesses are only in the 200–250 Å range for tantalum nitride, although thicknesses smaller than that are expected to be pursued by the industry in the upcoming years.

This invention provides an effective diffusion barrier having a thickness well below 100 Å, and below 5 Å in one exemplary embodiment, which is far below the minimum thickness projected by the industry data depicted in FIG. 2. The extremely thin diffusion barrier layers achievable by this invention potentially could be useable long after alternative technologies become obsolete.

Figure 3:
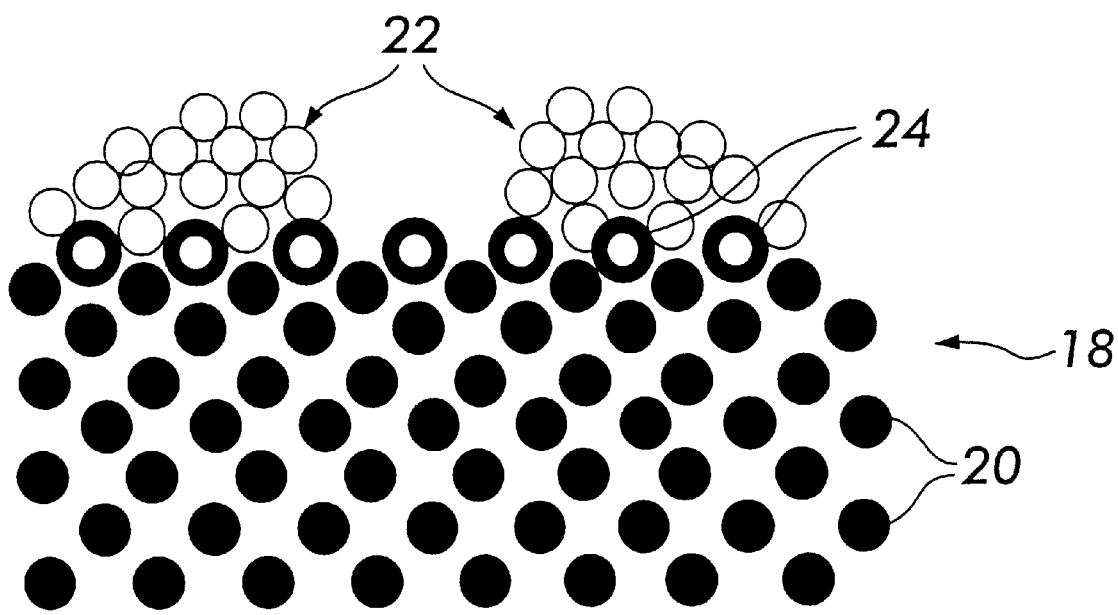
FIG. 3 is a schematic cross-section depicting the effect of a diffusion barrier in accordance with the invention.

Referring now to FIG. 3, a portion of an integrated circuit is schematically illustrated on an atomic level that comprises a silicon substrate 18 made up of silicon atoms 20, and having laterally delineated copper interconnect strips 22. At the upper surface of the silicon substrate 18, a monolayer of barium (Ba) atoms 24 is interposed between the conductor strips 22 and the surface of the substrate 18 and effectively prevents diffusion of the copper atoms into the silicon. The layer of Ba atoms need only have a thickness of one atomic layer, i.e., a monolayer of approximately 5×10$^{-10}$ meters (5 Å) in thickness, in order to provide the desired barrier to diffusion of the conductor into the adjoining substrate. The barium layer depicted in FIG. 3 illustrates the situation in which a single monolayer of barium is provided. The extremely small thickness of the diffusion barrier contributes to the reduction in both thickness and the lateral dimensions of the integrated circuit layer, and the ability to use copper interconnects and other conductor materials otherwise predisposed to creating diffusion problems (e.g., Au, Ag, Pt) instead of aluminum interconnects. As such, the present invention represents a remarkable breakthrough in the field.

As will become apparent from the following description, in one mode of this invention, a diffusion barrier comprised of metal atoms and having a thickness of not more than approximately 5 Å is achievable by depositing a metal halide precursor compound on a semiconductor or insulating substrate so as to form a temporary heteroepitaxial film thereon. Then, the resulting temporary heteroepitaxial film created by the metal halide and the substrate surface is subjected to a post-growth anneal or chemical etching in which all of the temporary heteroepitaxial film is eliminated by removal from the substrate except for an atomic layer of the metal component, i.e., a monolayer. This residual monolayer of metal atoms disposed in contact with the substrate surface provides a diffusion barrier to conductor materials.

Figure 4:
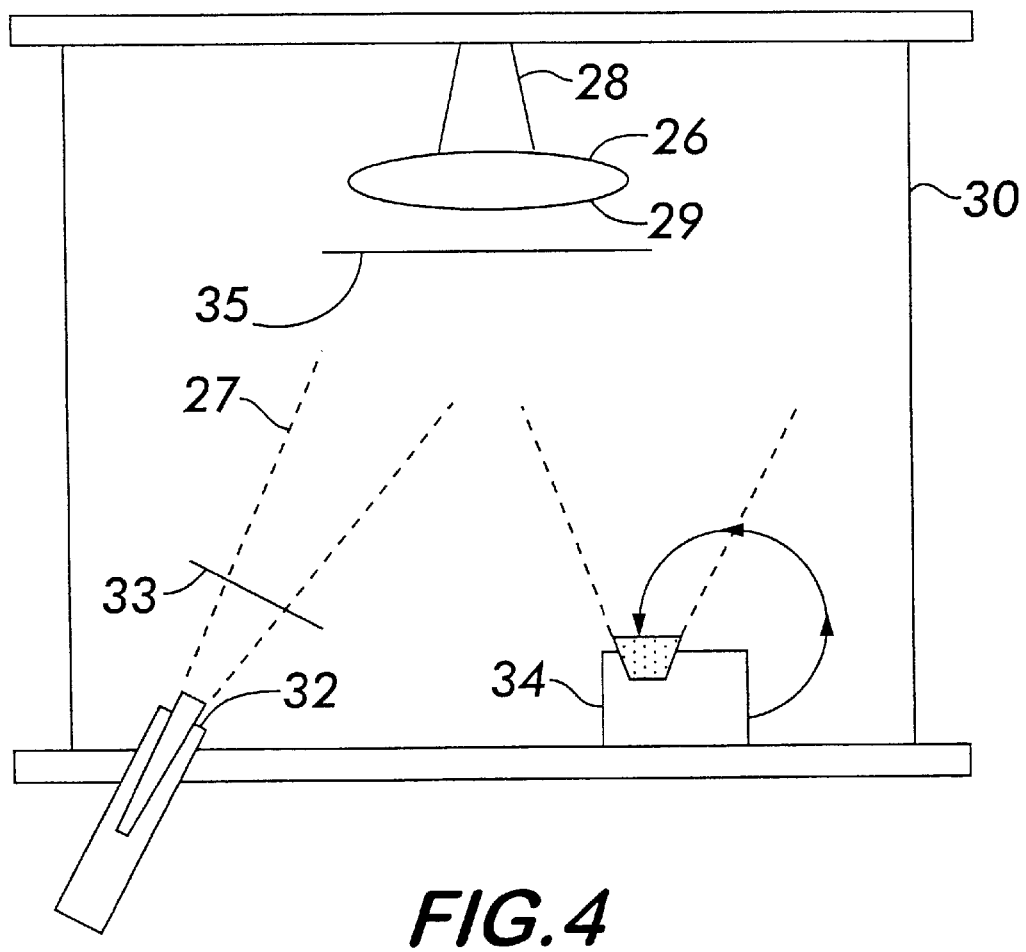
FIG. 4 is a schematic diagram illustrating the process of deposition of a diffusion barrier precursor compound, and a metallization layer, onto a substrate by molecular beam epitaxy.

One suitable approach for depositing the metal halide used as a precursor compound for forming the diffusion barrier layer is molecular beam epitaxy (MBE), such as depicted in FIG. 4. A substrate 26, e.g., a silicon wafer, is supported on a rotating holder 28 within a conventional MBE deposition chamber 30. The deposition chamber is illustrated in simplified form. Not shown are provisions for raising the temperature of the substrate to annealing temperatures and for evacuating the chamber. Also not shown is a conventional Reflective High Energy Electron Diffraction (RHEED) diagnostic system directed toward the substrate 26.

A diffusion barrier precursor compound effusion cell, for example a barium fluoride, strontium fluoride or the like effusion cell, is provided at 32, and has a shutter 33. A shutter 35 is also provided for the silicon wafer 26. An electron beam source for the metallization layer, e.g., copper, is shown at 34.

In the operation of the MBE deposition apparatus of FIG. 4, the substrate 26 is placed inside the chamber 30 and positioned by rotatable holder 28 and the chamber 30 is evacuated, using ion pumps and liquid nitrogen trapping to achieve a high vacuum. The substrate 26 is vacuum annealed to remove any passivation layer by deoxidation, for example silicon dioxide in the case of a silicon wafer.

The temperature of the substrate 26 is then reduced to a suitable deposition temperature, and the effusion cell 32 is heated while the substrate 26 is mechanically rotated. The electron beam of a RHEED diagnostic system is focused onto the substrate 26 and the RHEED pattern is monitored. When the RHEED pattern corresponding to the single crystal substrate surface appears (indicating complete removal of the passivation layer) on the RHEED screen, the shutters 35 and 33 in front of the substrate holder 28 and the effusion cell 32, respectively, are opened to allow precursor molecules to impinge on the substrate surface 29. Deposition of the precursor 27 onto the silicon surface 29 begins, and is allowed to continue until the single crystal silicon RHEED pattern disappears and is replaced by a pattern corresponding to a single crystal layer of the precursor compound. Deposition is halted by closing the substrate and effusion source shutters 35 and 33, respectively. By this juncture, a temporary heteroepitaxial film derived from the precursor molecules is situated on the substrate surface 29, although the nature of the interface is more complicated as will become apparent from later descriptions herein.

During the deposition of the precursor 27 on the substrate 26, the substrate 26 should be at a temperature in the range from approximately 500° C. to 800° C., and ideally at approximately 750° C., though the temperature will vary depending on the particular substrate and the processing tool. The pressure within the deposition chamber 30 should be 10$^{-8}$ mbar or less, more preferably 10$^{-9}$ mbar or less, and still more preferably 10$^{-10}$ mbar or less, in the case of depositing a metal halide on a silicon substrate. The time required to achieve adequate deposition of the precursor sufficient to form the temporary heteroepitaxial film on the substrate is typically one or two minutes, but is not limited thereto.

Following the deposition on the substrate of the temporary heteroepitaxial film derived from the precursor compound, the temperature of the substrate is raised to cause precursor molecules to detach from the temporary heteroepitaxial film on the substrate. In the case of BaF$_2$, barium atoms adjacent to the substrate remain tightly adhered thereto as a two-dimensional monolayer, while fluorine atoms (as bonded to other barium atoms) in the temporary heteroepitaxial film are effectively re-evaporated in the form of barium fluoride and eliminated from the temporary heteroepitaxial film. This will cause the RHEED pattern to change in appearance. Specifically, the "reappearance" of a RHEED pattern similar to that for the single crystal substrate confirms that the precursor molecules have been evaporated. The substrate temperature at which the detachment of the precursor molecules with the halogen atoms from the temporary heteroepitaxial film takes place during the post-growth anneal step is not necessarily limited, but should be in the vicinity of 750° C. to 1000° C., preferably 800° C. The monolayer of metal atoms which remains on the substrate serves as the diffusion barrier between the substrate and any metallization layer subsequently deposited upon it. The metallization layer can be deposited by any of various standard microelectronic metallization methods, and, in this embodiment, it can be conveniently deposited while the substrate is still in the MBE chamber by operation of the electron beam source.

The crystallographic and chemical characterization of the aforesaid temporary heteroepitaxial film, and the effect of treatments thereof according to this invention to form a diffusion barrier film on the substrate, are now discussed in greater detail. Based on X-ray photoelectron spectroscopy (XPS) and heavy ion backscattering spectroscopy (HIBS) analyses of the precursor compound/substrate surface interfacial chemistry, the formation of an ultra-thin metal monoatomic layer (monolayer) on the substrate is considered to proceed by a multi-stage process, which is schematically illustrated in FIGS. 5A–E. XPS and HIBS analysis measurements referred to herein can be performed using generally available equipment and analyses protocol understood and implementable by one skilled in the art.

Figure 5A:
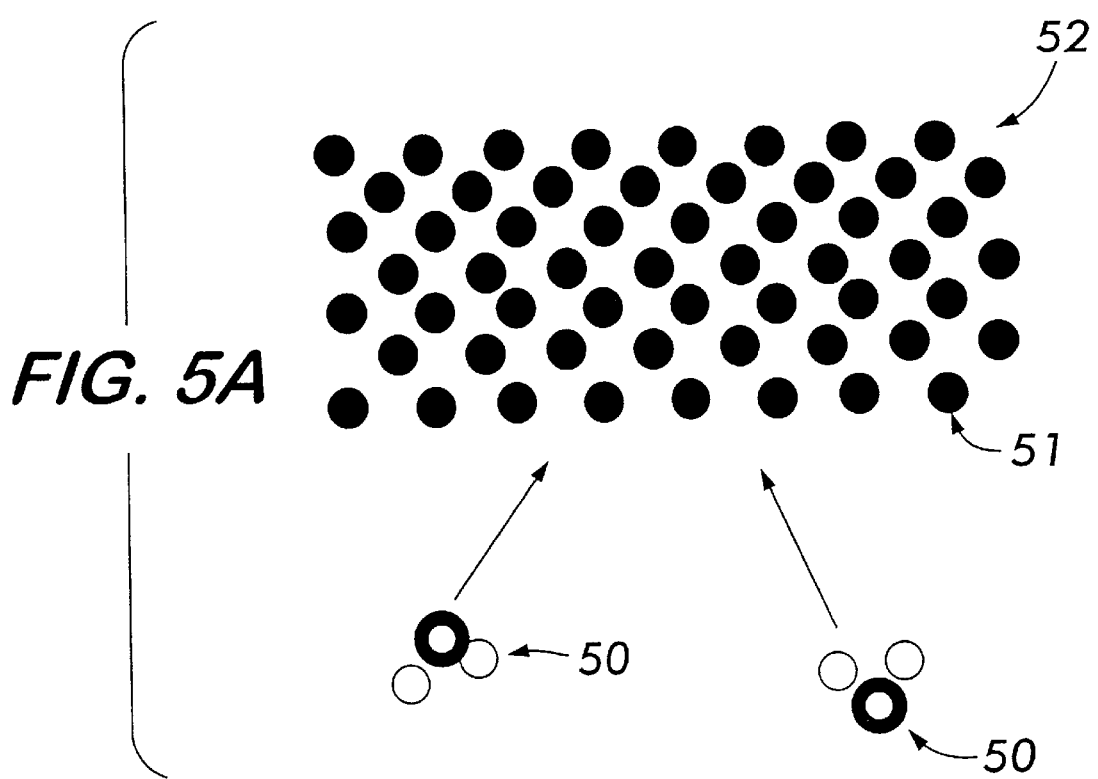

As schematically illustrated in FIG. 5A, $BaF_2$ molecules 50 are directed and impinged onto the surface 51 of a silicon substrate 52, such as by MBE deposition. For FIGS. 5A–E, $BaF_2$ is used to illustrate the metal halide, and silicon is used to illustrate the (semiconductor) substrate, although other materials can be used as indicated elsewhere herein.

Ideally, the silicon surface 51 to be used as the deposition substrate has a highly planar, smooth surface to minimize the coating thickness needed to provide complete coverage thereof. Deoxidation annealing, chemical-mechanical-planarization (CMP) polishing or ion milling can be used in a pretreatment of the silicon surface prior to deposition of the diffusion barrier to enhance the planarity and smoothness of silicon surface, if necessary. On the other hand, as will be described below, the inventive process itself provides some measure of in situ planarization of the silicon surface during MBE deposition.

Figure 5B:
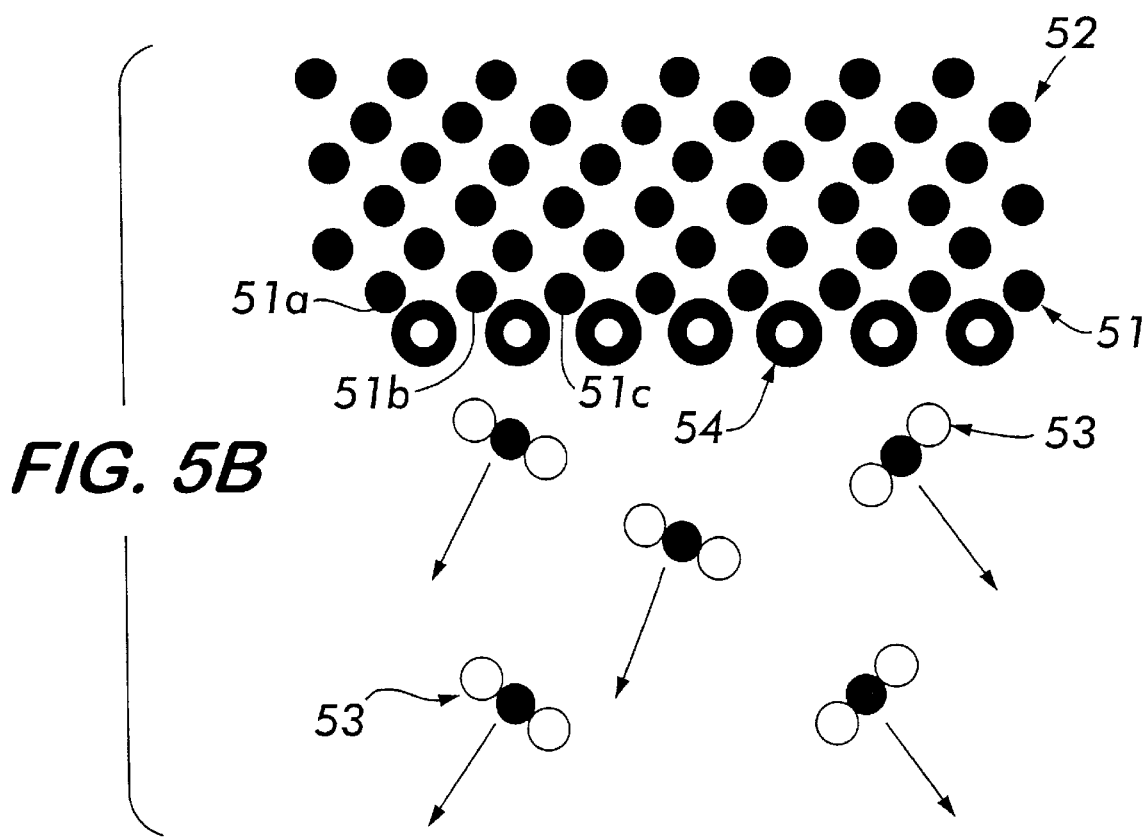

In any event, in the first step, the $BaF_2$ molecules react with silicon atoms 51a, 51b, 51c, and so forth, at the surface 51 of the silicon substrate 52. The Ba—F and silicon-silicon bonds at the surface of the silicon substrate are broken. As schematically shown in FIG. 5B, the free silicon and fluorine atoms at the vicinity of the interface where the barium fluoride molecules are contacting the silicon surface 51 then combine to form volatile silicon-fluoride compounds ($SiF_y$) 53 which escapes from the silicon substrate surface 51, and it is extracted from the MBE chamber via vacuum. Although FIG. 5B depicts compound 53 as two halide atoms (white circles) bonded to a common metal atom (darkened circle), it will be understood that this illustrative only because other gaseous metal-halides may be generated, such as tetrahalides of silicon where the substrate 52 is silicon. By comparison, if the substrate 52 instead is GaAs, the escaping gas 53 would be GaF. This etching-like effect upon the surface silicon atoms serves to effectively smoothen the silicon surface.

In any event, as illustrated in FIG. 5B, the barium atoms left behind bond with dangling bonds of the surface silicon atoms, forming a monoatomic layer 54 of metal atoms, i.e., a metal monolayer of barium atoms. This deposition step proceeds for a sufficient duration of time to form a continuous layer of barium atoms across the surface of the silicon substrate without leaving any bare spots.

Figure 5D:
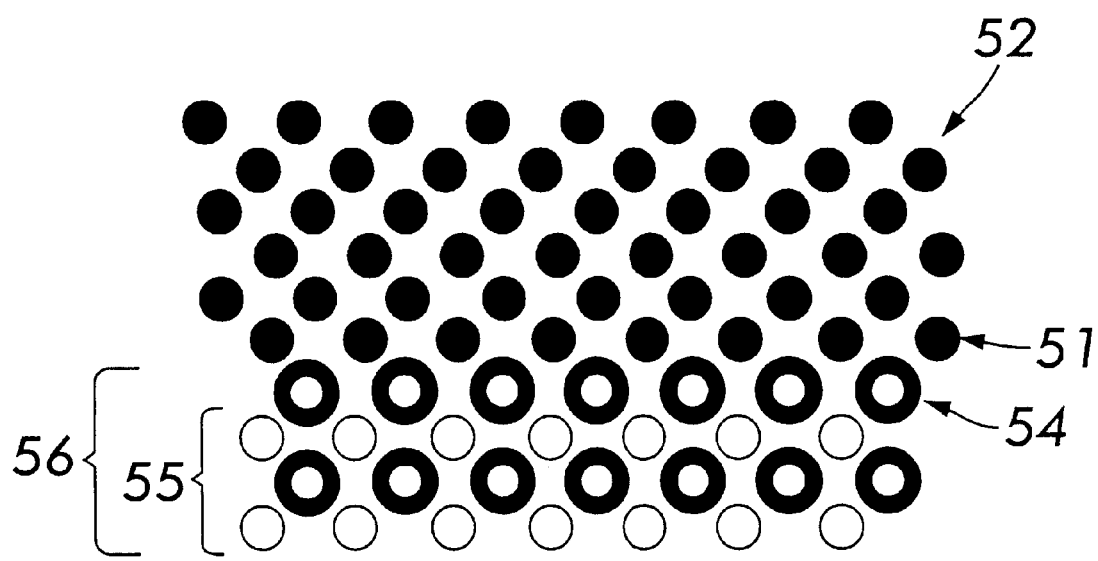

As illustrated in FIG. 5C, once complete coverage of the silicon substrate 52 with barium atoms 54 is achieved, barium fluoride 50 deposition via MBE is continued from a molecular beam. As illustrated in FIG. 5D, this subsequently introduced barium fluoride adheres to the barium monolayer 54 and grows epitaxially thereon to form a temporary homoepitaxial film portion 55. The amount of subsequent deposition of epitaxial barium fluoride on the barium monolayer is allowed to be enough to provide a safety measure which ensures complete substrate coverage with a monolayer of barium atoms. In this way a heteroepitaxial film 56 is formed on the substrate surface 51 comprising a monolayer 54 of metal (e.g., Ba) atoms as an interaction regime attached directly to the substrate surface 51 and a homoepitaxial regime 55 comprised of oriented molecular metal halide (e.g., barium fluoride) formed, in turn, on the monolayer 54. The homoepitaxial regime 55 of $BaF_2$ of the temporary heteroepitaxial film 56 is (100)-oriented on silicon (100), and (111)-oriented when the substrate is silicon (111), GaAs (100), or GaAs (111).

XPS measurements have confirmed that barium atoms have the two above-mentioned different chemical states, i.e., the interaction (metal monolayer) and the homoepitaxial regimes, in the temporary film present at this stage of processing. The relative abundance of these two states has also been determined by XPS. The number of barium atoms in each state is determinable by normalizing integrated XPS peak intensities to HIBS measurements of the total number of barium atoms on the surface. The results of these analyses confirm that $BaF_2$ first reacts with the silicon surface during initial MBE deposition at the silicon surface and dissociates, releasing a gaseous silicon-fluorine compound. This reaction is self-limiting, resulting in a barium monolayer that enables subsequent $BaF_2$ molecules to form an epitaxial (111)-oriented film on the silicon surface. Then, a post-growth anneal affects evaporation of the barium fluoride deposited on the monolayer.

Figure 5E:
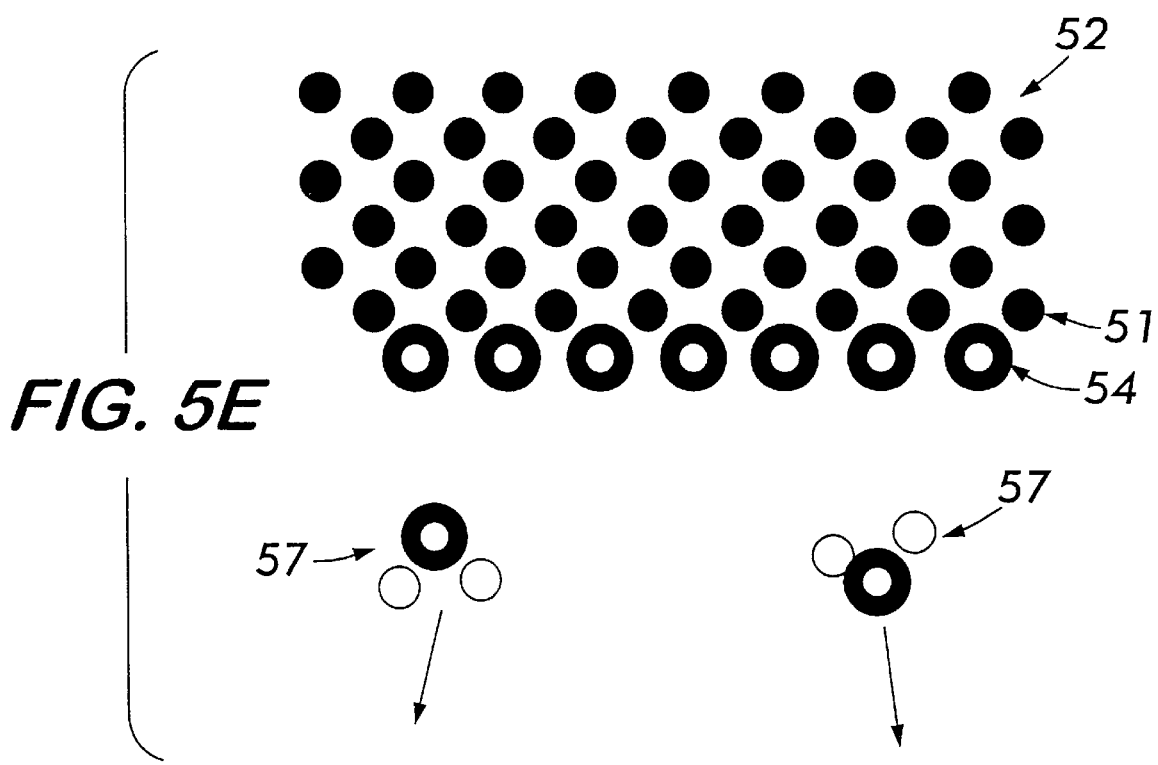

That is, as illustrated in FIG. 5E, in a second stage of this inventive procedure, which is conducted after the MBE deposition of the metal halides on a substrate to form the temporary heteroepitaxial film 56 shown in FIG. 5D, a vacuum anneal is performed to cause evaporation of barium fluoride 57 from the temporary heteroepitaxial film such that the barium fluoride content found in the homoepitaxial portion thereof (feature 55 in FIG. 5D) is completely removed back to the monolayer 54 of barium atoms attached to the silicon surface 51. Alternatively, the homoepitaxial portion 55 of the temporary heteroepitaxial film can be removed by etching (e.g., chemical etching) which is selective between the homoepitaxial portion 55 and the monolayer portion 54 such that the former can be removed while leaving the latter intact.

In any event, prior to performing the post-growth anneal (or etching) to remove the homoepitaxial portion 55 of the temporary heteroepitaxial film, there is no practical limit on how thick the overdeposit of barium fluoride can be that is formed over the barium monolayer. However, it will be appreciated that the thicker the deposited barium fluoride layer(s) of the homoepitaxial portion of the temporary film is made to be, the longer the post-growth anneal time that will be necessary to decompose the deposited thickness of barium fluoride molecules back to the monolayer of barium atoms left attached to the substrate surface.

The MBE deposition of the temporary heteroepitaxial film and the post-growth anneal can be performed in the same processing chamber without breaking the vacuum between the two procedures. Alternatively, the MBE deposition can be performed in a first processing tool, after which the vacuum is broken, and the workpiece is then transferred to another processing tool for separately performing the post-growth anneal at which time the substrate is heated up again with a vacuum being created in the second processing tool. In the latter case, the homoepitaxial portion of the temporary heteroepitaxial film serves as a protective coating over the monolayer portion of the heteroepitaxial film during such transit between separate processing tools.

In that the atomic diameter of barium is 4.48 Å, and that of strontium is 4.29 Å, it can be appreciated how the formation of a monolayer of these metal atoms, for example, on a substrate by the techniques presented herein permits the formation of an extremely thin, yet effective diffusion barrier.

While not desiring to be bound to any particular theory, it nonetheless is thought that the underlying mechanism by which the metal monolayer prevents diffusion of the copper, or other highly diffusive metal, through the barrier layer into the semiconductor or insulating substrate is at least in part attributable to the fact that metal atoms are provided in the monolayer which have relatively large electron clouds which can overlap or touch each other between the metal atoms to effectively form an energy barrier against movement of copper atoms therethrough. As will be understood by one of ordinary skill in the art, from a standpoint of terminology, the electron clouds are also spoken of as atomic orbitals occupied by electrons in different energy levels or shells, and the electron cloud is a cloud of negative charge formed of electrons of an electron density distribution corresponding to the element at issue.

An important advantage of the invention is the ease with which the diffusion barrier layer can be formed. Where metal halides are used as a precursor in forming the diffusion barrier film, the precursor, e.g., $BaF_2$ or $SrF_2$, can be deposited for a sufficient duration of time to ensure complete coverage of the silicon substrate. Such complete coverage can be achieved within relatively short period of time, e.g., about one minute using MBE deposition of a metal halide on the substrate, depending on deposition conditions. Also, the length of deposition time is not critical provided it is at least high enough to establish the diffusion barrier film; deposition times of several minutes are not detrimental to the procedure, and the deposition temperature also is not critical. In the second step, all components of the precursor except for the monolayer of metal atoms, are removed by the post-growth annealing procedure. The metal atoms of this thin layer adhere tightly to the substrate, and consequently, the second step can be carried out over a wide range of time and temperature conditions without adversely affecting the formation and character of the diffusion barrier layer.

By way of a specific illustration of forming a diffusion barrier on a semiconductor substrate, $BaF_2$ can be used as the barrier film precursor and a silicon wafer can be used as the substrate. The silicon substrate first is deoxidized by vacuum annealing at 900° C. for one hour to remove the silicon dioxide passivation layer. Then the substrate can be brought to a deposition temperature of 750° C. in a VG Semicon V8OH MBE growth chamber at a vacuum of less than $1 \times 10^{-10}$ mbar. All temperature measurements are made from a noncontact thermocouple gauge. A $BaF_2$ effusion cell can be heated to 1050° C. While the substrate holder is mechanically rotated, an electron beam from a RHEED diagnostic system is directed toward the substrate. The beam is focused until the RHEED pattern of a single crystal silicon surface appears on the RHEED screen. The shutters in front of the substrate holder and the effusion cell are then opened to allow $BaF_2$ molecules to impinge on the substrate surface. Deposition of $BaF_2$ is allowed to continue until the single crystal silicon RHEED pattern disappeared and is replaced by a single crystal $BaF_2$ pattern. Deposition is then halted by closing the substrate and effusion source shutters. The substrate temperature is then raised to 800° C. and held until a RHEED pattern similar to that of the single crystal silicon substrate reappears. It will be understood that the above-provided exemplary protocol is provided merely for sake of illustration, and not limitation.

In the mode of the invention being discussed above in which metal halides are used as precursor compound for forming the diffusion barrier film, the precursor compounds that can be used include, for example, $BaF_2$, $BaCl_2$, $SrF_2$, $SrCl_2$, CsFl, CsCl, RbF, and RbCl, and the like. Especially preferred are those metal halide salts that have cubic halide, e.g. a cubic fluorite, crystal structure. While not desiring to be limited to any particular theory at this point, applicants nonetheless consider that precursor compounds obtainable as metal halides, e.g., $BaF_2$, $BaCl_2$, $SrF_2$, $SrCl_2$, CsFl, CsCl, RbF, and RbCl, and the like, that have cubic crystal structure will tend to provide sources of metal atoms that are amenable to the above-discussed decomposition reaction and interaction with the silicon surface under readily implementable MBE and annealing processing conditions. Although not desiring to categorically exclude all metal halide salts having rutile crystal structure, rutile metal halide salts may not be suitable for many processing environments as they do not normally decompose under typical MBE conditions.

In another mode of the invention for forming the diffusion barrier film, the monolayer of metal atoms alternatively can be formed in a one step operation (i.e., without a post-growth anneal step) by directly depositing an elemental form of the metal atoms, such as barium, via MBE on the surface of the semiconductor substrate. Since certain elemental metals such as barium are highly reactive, appropriate precautions have to be taken to handle, maintain and process the elemental barium in an inert environment, e.g., under an argon gas atmosphere, up until it is deposited upon the semiconductor.

Figure 7A:
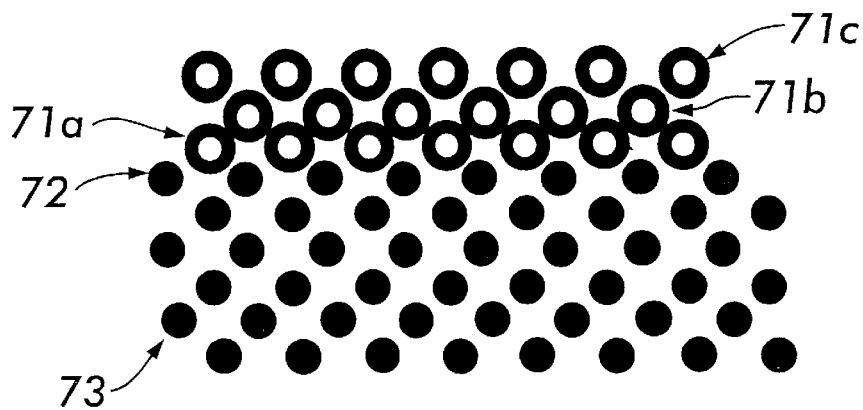

Also, in another embodiment of this invention, it is possible to form the monolayer of metal atoms directly on the semiconductor substrate by the above-described two-step decomposition reaction process involving a metal halide (i.e., MBE deposit/post-growth anneal), and then to increase the thickness of the diffusion barrier film by depositing one or more additional monolayers of metal atoms on the original monolayer through depositing the elemental form of the metal atoms, such as barium, via MBE on the original monolayer. That is, while formation of a single monolayer on the substrate as described above is sufficient to meet the diffusion barrier objectives of this invention, it is also within the scope of this invention to form one or more additional monolayers of the metal on the original monolayer as long as the overarching objective of forming a diffusion layer of extremely small thickness is maintained. For example, the metal atom can be deposited from an elemental form via MBE on the surface of the silicon substrate. In this way, a plurality of monolayers can be formed as contiguous layers upon the substrate to form an overall thickness in the diffusion barrier layer of any desired thickness. Since thin thicknesses are desired, the diffusion barrier preferably is built up to an overall thickness that does not exceed 100 Å, and more preferably does not exceed 20 Å. FIG. 7A illustrates this scenario in which a plurality of monolayers 71a, 71b, and 71c are sequentially formed, upon the surface 72 of substrate 73, one on the other, in the manners described above. Then, a conductor material or other material (not shown) can be formed over the outermost monolayer 71c. In this embodiment, each of monolayers 71a, 71b, and 71c are formed of the same type of metal atoms, and together, they form the barrier film. Also, while three monolayers are depicted in FIG. 7A, the plurality of monolayers can be two or more.

Figure 7B:
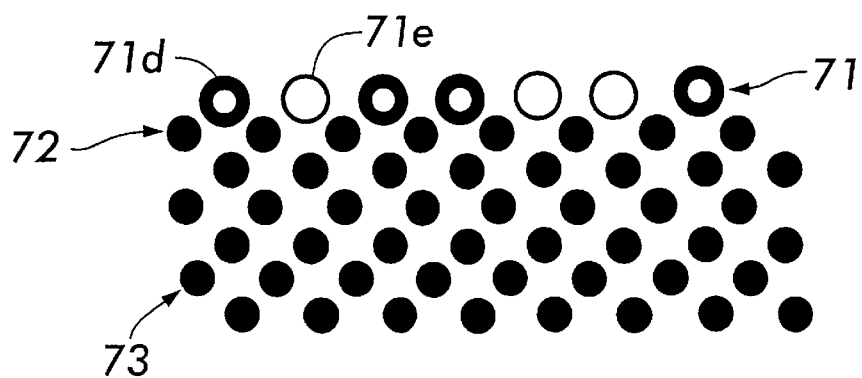
FIG. 7B shows another embodiment of the invention where the barrier film is a composite monolayer formed of different types of metal atoms.

Also, it is possible to deposit a combination of different types of metal atoms during precursor deposition on a substrate to form a composite diffusion barrier monolayer. For example, because the melting and sublimation temperatures of strontium fluoride and barium fluoride are similar, the temperature ranges for MBE deposition of a strontium fluoride precursor onto silicon and for the evaporation of the strontium fluoride precursor from silicon almost completely overlap those given above for barium fluoride. Thus, temperatures in the mid-portion of the ranges given for barium fluoride on silicon are also satisfactory for the MBE deposition and evaporation of strontium fluoride. However, the temperatures required to sublimate, i.e., directly change the state of the source solid crystal form to a gas for deposition via MBE, for barium fluoride and strontium fluoride are slightly different. Consequently, to control the ratio of barium to strontium in a composite monolayer of a barrier layer to be formed, the barium fluoride and strontium fluoride should be deposited using separate effusion cells for the MBE chamber. In any event, a composite monolayer can be formed of barium and strontium atoms in this manner. FIG. 7B illustrates this embodiment of the invention where the barrier film is a composite monolayer 71 formed of different types of metal atoms 71d and 71e. Two or more different types of metal atoms can be provided in the composite monolayer 71. Then, a conductor material or other material (not shown) can be formed over the composite monolayer 71.

Figure 7C:
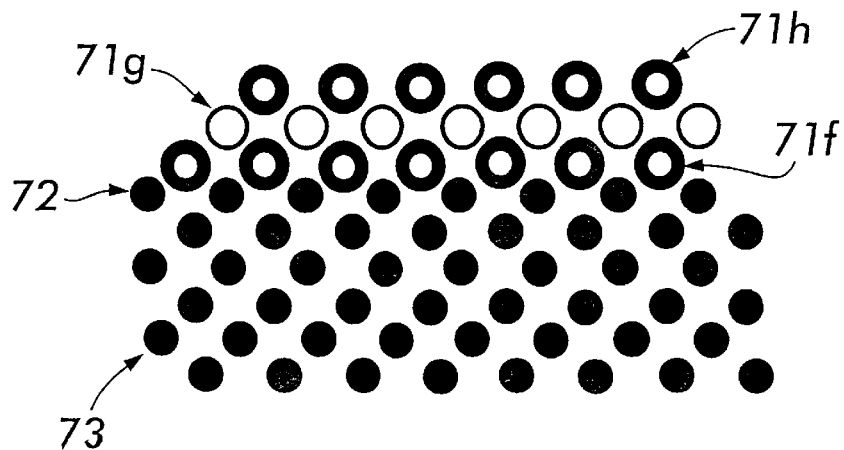
FIG. 7C shows yet another embodiment where the barrier film is comprised of a plurality of contiguous monolayers in which different monolayers thereof are formed of different types of metal atoms.

Also, if an additional monolayer or monolayers are deposited on the original monolayer formed on the surface of the substrate, the different monolayers can have the same or different types of metal atoms by appropriate selection of the precursor compounds at the different stages of processing. For instance, as illustrated in FIG. 7C, the barrier film is comprised of a plurality of contiguous monolayers 71f, 71g and 71h in which different monolayers thereof are formed of different types of metal atoms. In this illustration, layers 71f and 71h are formed of the same type of metal atoms while intervening monolayer 71g is formed of a metal atom that is different from the metal atoms in layers 71g and 71h. However, there is no requirement that barrier film arrangements with three or more monolayers containing the different types of metal atoms must alternate through the stack of monolayers in any particular pattern. Also, while three monolayers are depicted in FIG. 7C, the embodiment is not limited to that plural number. Also, composite monolayers, such as described in FIG. 7B can be used in combination with one or more contiguous monolayers formed thereon having a single type of metal atoms, such as shown in FIG. 7A, or different types of metal atoms in different respective monolayers, such as illustrated in FIG. 7C.

Figure 6:
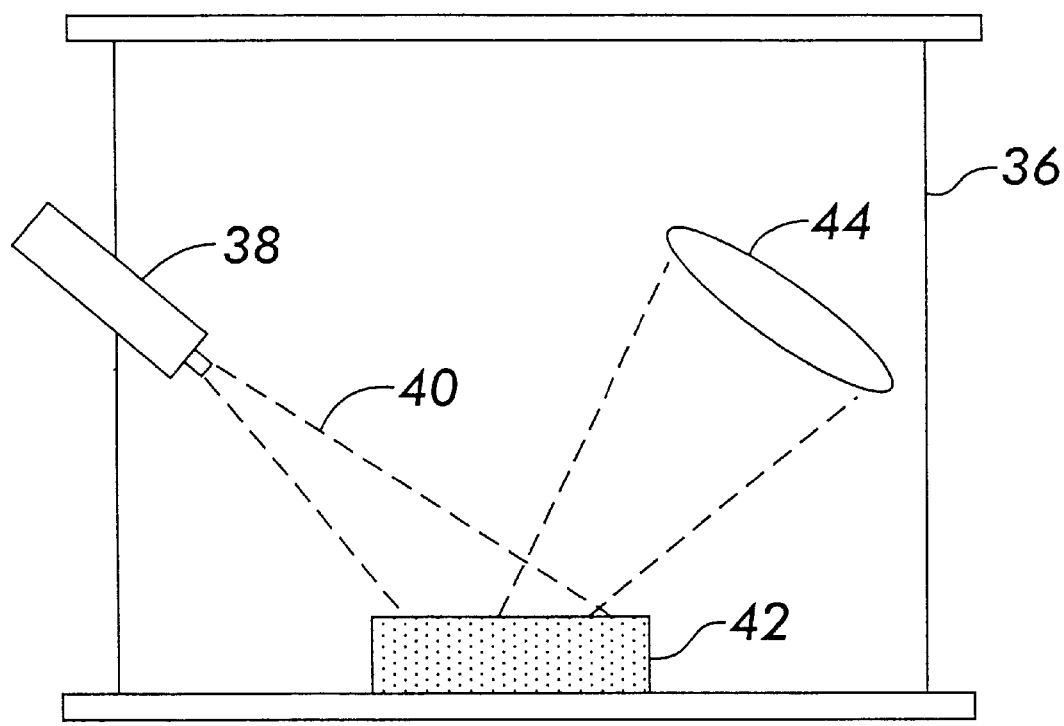
FIG. 6 is a schematic diagram illustrating the process of deposition of a diffusion barrier precursor compound onto a substrate by r.f. sputtering.

As yet another mode of applying the metal halide precursor to the substrate to form the temporary heteroepitaxial film, r.f. sputtering, such as depicted in FIG. 6, can be used. In a sputtering chamber 36, an argon-ion gun 38 directs a beam 40 onto a supply (target) 42 of barium fluoride, for example, causing deposition of barium fluoride onto a substrate 44 by sputtering. Here, as in the case of MBE deposition, the post-growth annealing of the substrate can take place within the sputtering chamber in order to remove $BaF_2$ molecules and the fluorine atoms leaving only a thin layer of barium atoms as a monolayer adhering to the surface of the substrate. The metallization (conductor) layer can also be applied to the substrate while it is inside the sputtering chamber. Sputtering can also be used to deposit a diffusion barrier of other metal atoms, such as strontium atoms, in a similar manner. Also, a combination of different types of metal atoms could be sputtered in the same monolayer or in different monolayers using different sputtering targets formed of different respective metal halide precursors. In general, however, MBE is superior to r.f. sputtering because sputtering can cause dissociation of the barium-fluorine bond before the barium fluoride molecule reaches the substrate surface which facilitates the formation of the temporary heteroepitaxial film.

As other different modes for forming the diffusion barrier film on a substrate, deposition processes other than MBE and r.f. sputtering can be used, for example, physical and chemical vapor deposition, wet chemical processes, and liquid phase epitaxy. For instance, precursors used in metal-organic chemical vapor deposition (MOCVD) to form the diffusion barrier on a semiconductor or insulating substrate include Ba (2,2,6,6-tetramethyl-3,5 heptanedionate) and Sr (2,4-pentanedionate).

Figure 8:
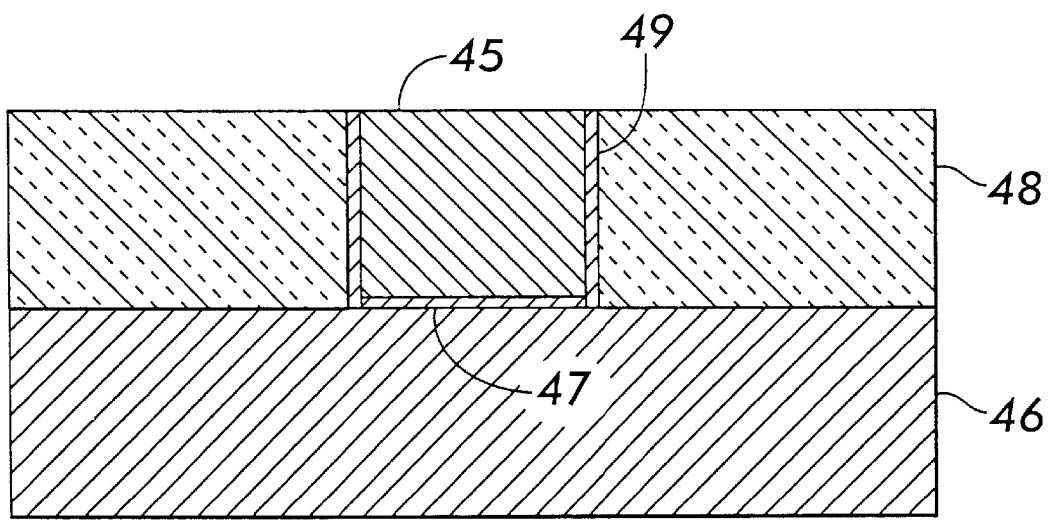
FIG. 8 is a schematic cross-sectional view showing a diffusion barrier in accordance with the invention preventing diffusion of a copper plug into silicon substrate and into a silicon dioxide insulating layer overlying the substrate.

As illustrated in FIG. 8, the diffusion barrier produced in accordance with the invention can be used not only to prevent diffusion of conductor metals into a semiconductor substrate, but also to prevent diffusion of the conductor metal into an insulating layer. In FIG. 8, layer 46 is a semiconductor substrate, for example, a semiconducting layer of silicon, and layer 48, which overlies layer 46, is an insulating layer of silicon dioxide ($SiO_2$). A plug 45 of a metal, such as copper, is located in a via hole though insulating layer 48, and makes ohmic contact with the semiconducting layer 46 through a thin diffusion barrier layer 47 of barium formed by one of the processes described above. This plug is used to conduct current between layer 46 and another layer (not shown) which is separated from layer 46 by insulating layer 48. In the same process, the sidewall of the via hole is lined with a barium diffusion barrier 49, which prevents diffusion of the copper into the insulating layer. The barium or strontium atoms are deposited onto an insulating layer in the same way in which they are deposited onto silicon.

As will be apparent from FIG. 8, the minimization of the thickness of the side wall diffusion barrier 49 makes it possible to use copper for interconnections between layers. The copper interconnects can be significantly narrower than tungsten interconnects having the same current capacity, and the diffusion barrier is also very thin. Therefore the use of the diffusion barrier in accordance with the invention as a liner for via holes in insulating layers, can contribute significantly to the minimization of the lateral dimensions of an integrated circuit of which the elements shown in FIG. 8 are a part. Because the diffusion barrier 49 is very thin, it permits the use of via holes of relatively low aspect ratio, making them easier to fill with conducting metal and eliminating voids which result in failures or rejection of ICs.

It will be understood that this invention is not limited to the above-illustrated substrate materials, conductor materials, and materials used to make the diffusion barrier, as long as other criterion understood and set forth herein for these respective materials are satisfied.

For instance, the material used for forming the diffusion barrier can be any appropriate metal in elemental form or precursor molecular compound from which a layer of metal atoms (i.e., a monolayer) can be formed on a semiconductor or insulating substrate.

The substrate material upon which the diffusion barrier is formed is not particularly limited and can include semiconductor materials and insulating materials used in semiconductor device fabrications. The semiconductor material can be, for example, Si, Ge, InP, GaAs, SiC, GaN, AlN, InSb, PbTe, CdTe, HgTe, $Hg_zCd_{1-z}Te$, PbSe, PbS, and tertiary combinations of these materials. The semiconductor material can be monocrystalline or polycrystalline. The semiconductor substrate can be in bulk wafer form, deposited or grown layer form (e.g., epitaxially grown), or silicon-on-insulator (SOI) form. The semiconductor can be doped or undoped with impurities (e.g., p-, n-doping). The insulating substrate material can be, for example, $SiO_x$, $SiO_2$, $BaF_2$, $SrF_2$, $CaF_2$, silicon nitride, PSG, or BPSG. For example, a thin diffusion barrier film formed of a barium, strontium or cesium monolayer (or monolayers) can be used to line via holes in insulators made of $BaF_2$, $SrF_2$ and $CaF_2$.

As to the types of conductor materials that can be formed on the diffusion barrier, these include conventional metals and metal alloys used for wiring line, interconnects, bonding pads, and so forth, in semiconductor device or optoelectronic device fabrication. The present invention is especially useful for providing an in situ barrier to electrically conductive metals which tend to diffuse into semiconductor and insulating materials common to semiconductor processing. These conductive metals include, for example, pure copper, copper alloys (e.g., Cu—Al, Cu—Si—Al), copper doped with a dopant (e.g., aluminum) that impedes electromigration, gold, silver, or platinum. In the case of copper, it may be desirable to alloy it with small percentages (e.g., <5%) of other metallic substances to prevent electromigration. The conductor material can be deposited on the diffusion barrier by any conventional technique, including, e.g., electroplating, electroless deposition, sputtering, chemical vapor deposition, e-beam evaporation, and so forth. For example, copper can be deposited by e-beam evaporation at $1\times10^{-9}$ millibars in a heated chamber, or at $10\times10^{-11}$ millibars under a nitrogen environment. The conductor film can be patterned on the diffusion barrier by various techniques, such as by conventional additive or subtractive processes known and used in semiconductor processing (e.g., photolithographic processing). The invention can also be used to prevent diffusion of gallium and/or arsenic from gallium arsenide into silicon and other substrates.

A number of advantages and improvements are achieved by the present invention which can be exploited in the semiconductor device processing industry. A principal advantage of this invention is that the thickness of the diffusion barrier layer can be made extremely thin. In practice, depending on the surface characteristics of the substrate material onto which the diffusion barrier layer is deposited, the thickness of the diffusion barrier layer according to this invention will generally be formed in the range of approximately 5 Å to 100 Å. In the case of a smooth, highly planarized substrate material, a substrate having a surface roughness well below 5 Å, the diffusion barrier can be made as thin as one monolayer, which will have a thickness slightly less than 5 Å corresponding the atomic diameter of the metal atoms forming the diffusion barrier. For such smooth substrates, the diffusion barrier formed of one monolayer having a thickness less than 5 Å in thickness will satisfactorily inhibit diffusion of copper and other conductors into the substrate. With substrate materials having a relatively greater surface roughness, the thickness of the diffusion barrier layer will tend to vary. For instance, the diffusion barrier layer on a substrate having a surface roughness greater than 5 Å may be formed so as to have a thickness value in the range of approximately 5 to 100 Å, with metal atoms of the diffusion barrier layer accumulating at any step edges on the substrate surface. Thus, the diffusion barrier film of this invention is only one monolayer or a multiple number of contiguous monolayers formed on the substrate surface, and in any event, it need not be more than approximately 100 Å in total thickness to achieve the objectives of this invention for current and future anticipated semiconductor device fabrication specifications. A large scale integrated circuit having copper conductors and a diffusion barrier film according to this invention with a thickness in the range of approximately 5 Å to approximately 100 Å, can achieve an extremely high component density, which reduces the number of layers required for a given number of components, and very low heat dissipation. In the practice of this invention, therefore, the diffusion barrier thickness can vary from a thickness less than about 5 Å to a greater thickness, which can be up to about 100 Å, preferably up to no more than 20 Å. Conventional alternative diffusion barriers are significantly thicker than 100 Å.

Another advantage of the invention is that the diffusion barrier film, where it is barium or strontium, or a similar metal, is compliant, i.e., it is mechanically soft and easily deformable. The compliance of the diffusion barrier film allows dissimilar materials to be put together without introducing defects, such as voids or mechanical stresses, at the interface which may have detrimental effects on device performance, the diffusion barrier film, or the metallization layer. Furthermore, barium and strontium, or like metals, can form intermetallic compounds with copper ($BaCu_{12}$ and $Cu_5Sr$ are examples), causing copper atoms to be tightly bound to the barium or strontium at the interface and unable to migrate past the barium or strontium layer into the silicon.

Also, while the barrier film based on one or more monolayers of metal atoms that is used in this invention has been illustrated herein specifically as a barrier to diffusion of metal conductors into substrate materials, it will be understood that the barrier film is not necessarily limited to that use alone, as it possesses many advantageous attributes that could be exploited in semiconductor device fabrications. For example, the barrier film could be used as a barrier layer in the fabrication of semiconductor laser devices, such as those having heterojunctions and incorporating different semiconductor materials, e.g., GaAs on top of silicon.

While the invention has been shown and described with reference to certain preferred embodiments, it will be understood by those skilled in the art that changes in form and detail may be made without departing from the spirit and scope of the appended claims.

What is claimed is:

1. A semiconductor device comprising:
   a substrate;
   a barrier film, on said substrate, having a monolayer comprising at least two different types of metal atoms selected from the group consisting of barium atoms, strontium atoms, cesium atoms and rubidium atoms; and
   a material on said barrier film.

2. A semiconductor device comprising
   a substrate;
   a barrier film, on said substrate, having a first monolayer consisting of a first type of metal atoms selected from the group consisting of barium atoms, strontium atoms, cesium atoms, and rubidium atoms, and a second monolayer consisting of a second type of atoms selected from the group consisting of barium atoms, strontium atoms, cesium atoms, and rubidium atoms; wherein said first and second types of metal atoms are different from each other; and material on said barrier film.

3. A semiconductor device comprising:

a substrate material having a surface;

a barrier film on said substrate surface, said barrier film having a layer comprising at least two different types of elemental metal atoms selected from the group consisting of barium atoms, strontium atoms, cesium atoms, and rubidium atoms, where said layer comprising elemental metal atoms is immediately adjacent said surface of the substrate material;

a conductor on said barrier film, said conductor having a tendency to diffuse into said substrate material if in direct contact therewith; and wherein said layer comprising elemental metal atoms serves as a barrier, inhibiting diffusion of the conductor into the substrate material.

4. A semiconductor device according to claim 3, wherein said barrier film has a thickness of not more than approximately 100 Å.

5. A semiconductor device according to claim 3, wherein said barrier film has a thickness of not more than approximately 20 Å.

6. A semiconductor device according to claim 3, wherein said barrier film has a thickness of not more than approximately 5 Å.

7. A semiconductor device according to claim 3, wherein said barrier film is a single monolayer of barium atoms attached to said surface of said substrate material.

8. A semiconductor device according to claim 3, wherein said barrier film comprise a plurality of contiguous monolayers of barium atoms located on said surface of said substrate material.

9. A semiconductor device according to claim 3, in which said substrate material is a semiconductor.

10. A semiconductor device according to claim 3, in which said substrate material is a silicon semiconductor.

11. A semiconductor device according to claim 3, in which said substrate material is an insulating material.

12. A semiconductor device according to claim 3, in which said substrate material is silicon oxide.

13. A semiconductor device according to claim 3, in which the conductor is a metal.

14. A semiconductor device according to claim 3, in which the conductor comprises copper.

15. A semiconductor device according to claim 1, wherein said barrier film comprise a plurality of contiguous monolayers each comprising at least two different types of metal atoms selected from the group consisting of barium atoms, strontium atoms, cesium atoms, and rubidium atoms located on said surface of said substrate material.

16. A semiconductor device comprising:

a substrate;

a barrier film, on said substrate, having a layer of elemental metal atoms comprising at least two different types of metal atoms selected from the group consisting of barium atoms, strontium atoms, cesium atoms, and rubidium atoms; and a material on said barrier film.

17. A semiconductor device comprising:

a substrate;

a barrier film, on said substrate, comprising at least two different types of metal atoms selected from the group consisting of barium atoms, strontium atoms, cesium atoms, and rubidium atoms, having a thickness less than 100 Å; and a material on said barrier film.

* * * * *